United States Patent
Choi

(10) Patent No.: US 12,322,436 B2
(45) Date of Patent: Jun. 3, 2025

(54) MEMORY PACKAGE AND A MEMORY MODULE INCLUDING THE MEMORY PACKAGE

(71) Applicant: SK hynix Inc., Gyeonggi-do (KR)

(72) Inventor: Won Ha Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 149 days.

(21) Appl. No.: 18/178,531

(22) Filed: Mar. 6, 2023

(65) Prior Publication Data

US 2024/0119996 A1 Apr. 11, 2024

(30) Foreign Application Priority Data

Oct. 11, 2022 (KR) .................. 10-2022-0129714

(51) Int. Cl.
*G11C 11/00* (2006.01)
*G11C 11/4093* (2006.01)
(Continued)

(52) U.S. Cl.
CPC .......... *G11C 11/4093* (2013.01); *H01L 23/49* (2013.01); *H01L 23/5226* (2013.01); (Continued)

(58) Field of Classification Search
CPC ....... H01L 2224/16145; H01L 25/0652; H01L 25/0657; H01L 2924/00; H01L 2924/0002; H01L 2224/16225; H01L 2225/06513; H01L 2225/06541; H01L 25/18; H01L 2225/06517; H01L 2225/06562; H01L 23/48; H01L 23/481; H01L 23/642; H01L 24/05; H01L 24/14; H01L 24/16; H01L 25/0655; H01L 25/167; H01L 2924/01067; H01L 2924/14; H01L 2924/15192; H01L 2924/15311; H01L 2924/19041; H01L 22/32; H01L 2224/145; H01L 2224/48225; H01L 2224/73257; H01L 23/49; H01L 23/5226; H01L 24/48; H01L 24/73; H01L 25/065; H01L 25/16; H01L 2924/1436; H01L 2224/0554; H01L 2224/05573; H01L 2224/13025; H01L 2224/14181; H01L 2225/0651; H01L 2225/06544; H01L 2225/06565; H01L 23/50; H01L 23/5384;
(Continued)

(56) References Cited

U.S. PATENT DOCUMENTS

2019/0266115 A1 8/2019 Ware et al.
2021/0200699 A1 7/2021 Keeth et al.
(Continued)

FOREIGN PATENT DOCUMENTS

KR 10-2019-0053275 A 5/2019

*Primary Examiner* — Thong Q Le
(74) *Attorney, Agent, or Firm* — IP & T GROUP LLP

(57) ABSTRACT

A single memory package includes a package substrate; at least one of a memory chip and a buffer chip mounted on the package substrate; M×N number of interface data channel buses between the memory chip and the buffer chip; and (M×N)/$2^n$ number of outer data channel buses connected to the buffer chip. The buffer chip receives data from the memory chip through the interface data channel buses, and provides the data through the outer data channel buses. The M, N, and n are natural numbers.

14 Claims, 19 Drawing Sheets

(51) Int. Cl.
  *H01L 23/00*     (2006.01)
  *H01L 23/49*     (2006.01)
  *H01L 23/522*    (2006.01)
  *H01L 25/16*     (2023.01)
(52) U.S. Cl.
  CPC .............. *H01L 24/14* (2013.01); *H01L 25/16* (2013.01); *H01L 2224/145* (2013.01); *H01L 2924/1436* (2013.01)
(58) Field of Classification Search
  CPC . H01L 2924/00014; H01L 2924/10253; H01L 2924/1431; H01L 2924/1434; H01L 2924/157; H01L 2224/0555; H01L 2224/0556; H01L 2224/05599; H01L 23/538; H01L 24/47; H05K 1/0286
  See application file for complete search history.

(56) References Cited

U.S. PATENT DOCUMENTS

2022/0036500 A1    2/2022   Matam et al.
2023/0017863 A1*   1/2023   Park ........................ H01L 23/31

* cited by examiner

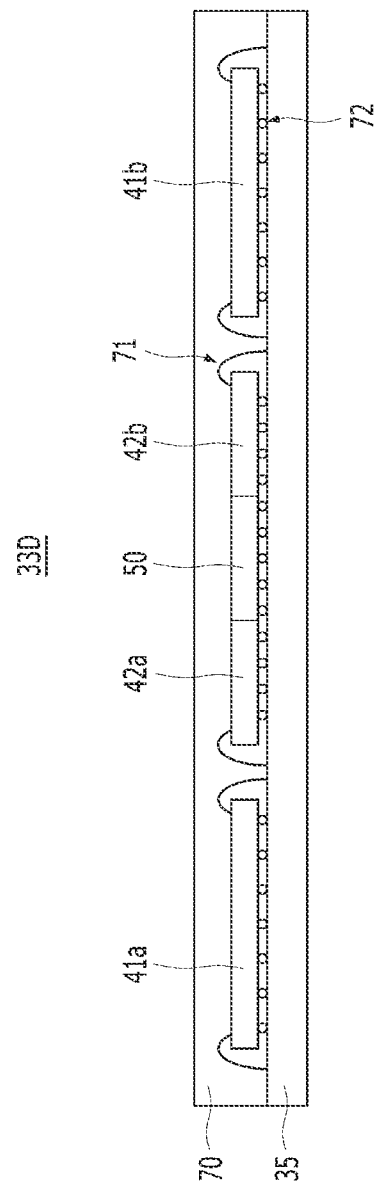

MEMORY PACKAGE AND A MEMORY MODULE INCLUDING THE MEMORY PACKAGE

CROSS-REFERENCE TO RELATED APPLICATIONS

The present application claims priority of Korean Patent Application No. 10-2022-0129714, filed on Oct. 11, 2022, which is incorporated herein by reference in its entirety.

BACKGROUND

1. Field

Embodiments according to the present invention disclosure relate to a memory package and a memory module including the memory package.

2. Description of the Related Art

Researchers are studying to develop next-generation memory technologies for increasing the data storage capacity of memory devices and speeding up data transfer rates.

SUMMARY

Embodiments of the present invention disclosure provide an efficient data channel bus technology capable of increasing data transmission speed.

Embodiments of the present invention disclosure provide a memory package including a buffer chip having a data scattering function capable of increasing data transmission speed.

Embodiments of the present invention disclosure provide a memory module including a memory package including a buffer chip having a data scattering function capable of increasing data transmission speed.

In accordance with an embodiment of the present invention disclosure, a single memory package includes a package substrate; at least one of a memory chip and a buffer chip mounted on the package substrate; M×N number of interface data channel buses between the memory chip and the buffer chip; and $(M \times N)/2^n$ number of outer data channel buses connected to the buffer chip. In operation, the buffer chip receives data from the memory chip through the interface data channel buses, and provides the data through the outer data channel buses. The M, N, and n are natural numbers.

In accordance with another embodiment of the present invention disclosure, a single memory package includes a package substrate; a first memory chip, a second memory chip, and a buffer chip mounted on the package substrate; a first set of N number of interface data channel buses between the first memory chip and the buffer chip; a second set of the N number of the interface data channel buses between the second memory chip and the buffer chip; and an N number of outer data channel buses connected to the buffer chip. The first memory chip and the buffer chip communicate with each other through the first set of the N number of interface data channel buses. The second memory chip and the buffer chip communicate with other through the second set of the N number of the interface data channel buses. The buffer chip communicates with an external device through the N number of the outer data channel buses. The buffer chip is configured to receive data from the first and second memory chips and output the data to the external device by operating in selected one mode of a chain data processing mode, an alternating data processing mode, a random scrambling data processing mode, an encoding data processing mode, and XOR data processing mode, wherein the N is a natural number.

In accordance with another embodiment of the present invention disclosure, a memory module includes a driving chip and a plurality of single memory packages disposed on a module substrate. Each of the single memory packages includes: a package substrate; and at least one memory chip and a buffer chip mounted on the package substrate; M×N number of interface data channel buses between the memory chip and the buffer chip; and $(M \times N)/2^n$ number of outer data channel buses connected to the buffer chip. The buffer chip receives data from the memory chip through the interface data channel buses, and provides the data through the outer data channel buses. The M, N, and n are natural numbers.

BRIEF DESCRIPTION OF THE DRAWINGS

FIGS. 5A to 5L are simplified block diagrams schematically illustrating configurations of memory packages according to embodiments of the present invention disclosure.

DETAILED DESCRIPTION

Figure 1A:
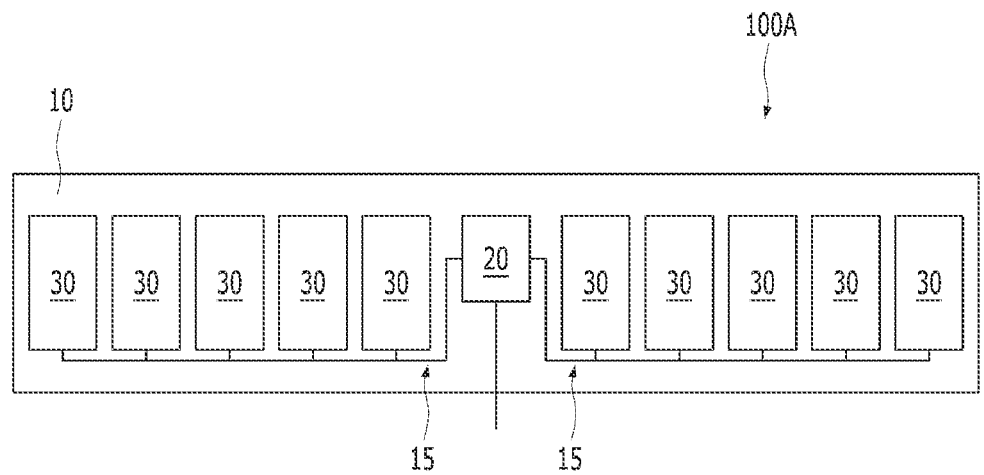
FIGS. 1A and 1B are simplified block diagrams schematically illustrating memory modules according to embodiments of the present invention disclosure.
Figure 1B:
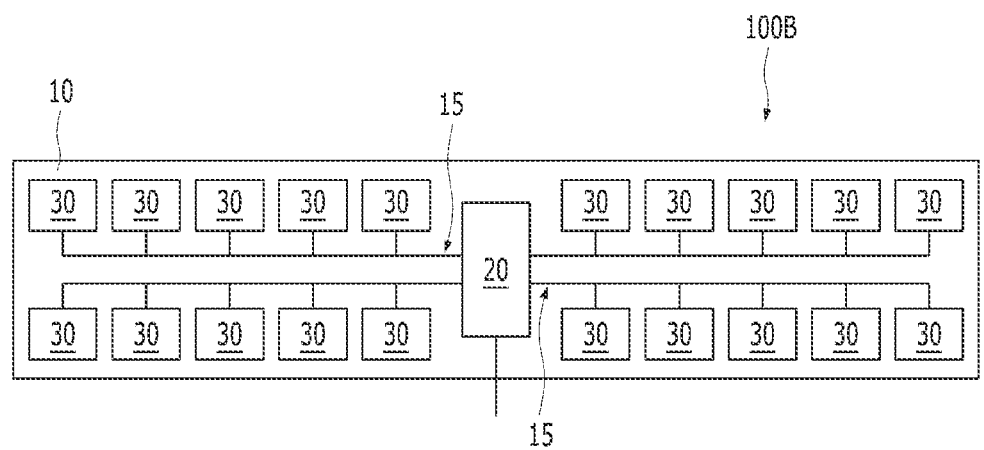

FIGS. 1A and 1B are simplified block diagrams schematically illustrating memory modules 100A and 100B according to embodiments of the present invention disclosure. Referring to FIGS. 1A and 1B, memory modules 100A and 100B according to embodiments of the present invention disclosure may each include a driving chip 20 and a plurality of memory packages 30 which are all mounted on a module substrate 10. The memory modules 100A and 100B may be one of a Dual In-line Memory Module (DIMM), an Un-buffered DIMM (UDIMM), a Registered DIMM (RDIMM), a Load Reduced Dual In-line Memory Module (LRDIMM), or a Multiplexer Combined Rank DIMM (MCR DIMM). The module substrate 10 may be a printed circuit board (PCB). The driving chip 20 may be a Register Clock Driver (RCD). The memory packages 30 may include one memory chip or a plurality of memory chips. The driving chip 20 may communicate with the memory packages 30 through module channel buses 15.

Figure 2A:
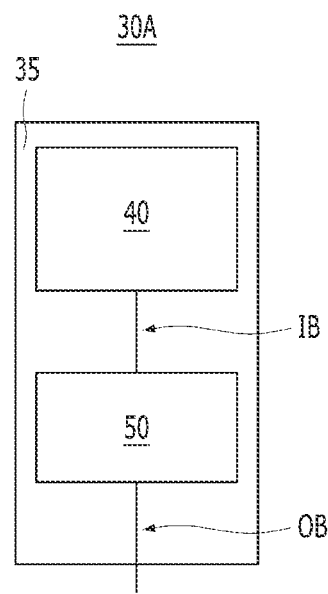
FIGS. 2A to 2G are simplified block diagrams schematically illustrating memory packages according to embodiments of the present invention disclosure.

FIGS. 2A to 2G are simplified block diagrams schematically illustrating memory packages 30A to 30G according to embodiments of the present invention disclosure. Referring to FIG. 2A, a memory package 30A according to an embodiment of the present invention disclosure may include a memory chip 40 and a buffer chip 50 both mounted on a package substrate 35. The memory chip 40 and the buffer chip 50 may be electrically connected to each other through an interface data channel bus IB. The buffer chip 50 may buffer, latch, collect, or scatter data of the memory chip 40.

The buffer chip 50 may be electrically connected to the driving chip 20 or an external device through an outer data channel bus OB. The outer data channel bus OB may be electrically connected to the module channel bus 15 shown in FIGS. 1A and 1B.

Figure 2B:
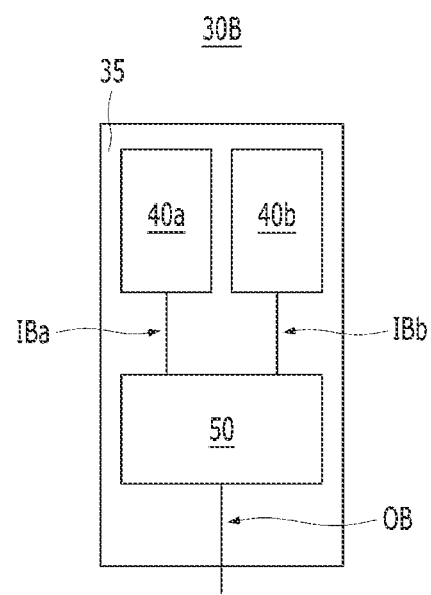

Referring to FIG. 2B, a memory package 30B according to an embodiment of the present invention disclosure may include at least two memory chips 40a and 40b, and one buffer chip 50. The memory chips 40a and 40b may be commonly connected to the buffer chip 50 through a first interface data bus IBa and second interface data bus IBb, respectively. The buffer chip 50 may buffer, latch, collect, or scatter data of the two memory chips 40a and 40b, respectively or simultaneously.

In an embodiment, the package substrate 35 may be a printed circuit board (PCB). In another embodiment, the package substrate 35 may include a redistribution layer. The redistribution layer may include a silicon layer. In an embodiment, the memory chips 40, 40a, and 40b may be individually packaged in single unit packages, meaning that each of the memory chips 40, 40a, and 40b may be a single package. Likewise, the buffer chip 50 may be a unit package individually packaged. Hence, the memory package 30A may include packaged memory chip 40 (i.e., the memory chip package), and the packaged buffer chip 50 (i.e., buffer chip package). Also, the memory package 30B may include packaged memory chips 40a and 40b (i.e., the memory chip packages), and the packaged buffer chip 50 (i.e., buffer chip package). In an embodiment, at least one of the memory chips 40, 40a, and 40b, and the buffer chip 50 may be unpackaged wafer level chip. For example, the memory package 30A may include a wafer level memory chip 40, and/or a wafer level buffer chip 50 mounted and bonded on a redistribution layer including a silicon layer. Also, for example, the memory package 30B may include a wafer level memory chip 40a, and 40b, and/or a wafer level buffer chip 50 mounted and bonded on a redistribution layer including a silicon layer. In an embodiment, at least one of the memory chips 40, 40a, and 40b, and/or the buffer chip 50 may be provided in a chiplet form. For example, at least one of the wafer level memory chips 40, 40a, and 40b, and/or the buffer chip 50 may be mounted on the package substrate 35 or the redistribution layer in the chiplet form.

Figure 2C:
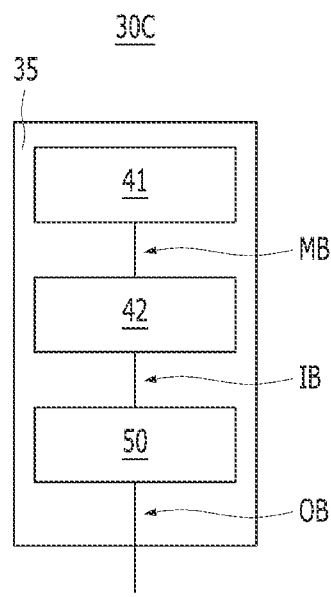
Figure 2D:
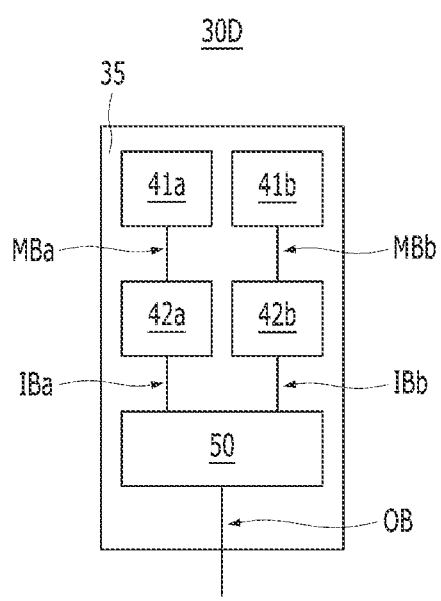

Referring to FIG. 2C, a memory package 30C according to an embodiment of the present invention disclosure may include a memory core chip 41, a memory logic chip 42, and a buffer chip 50 all mounted on a substrate 35. The memory core chip 41 and the memory logic chip 42 may be electrically connected to each other through a memory data channel bus MB. The memory logic chip 42 and the buffer chip 50 may be electrically connected to each other through an interface data channel bus IB. Referring to FIG. 2D, a memory package 30D according to an embodiment of the present invention disclosure may include at least two memory core chips 41a and 41b, at least two memory logic chips 42a and 42b, and one buffer chip 50 all mounted on a substrate 35. For example, the memory chips 40, 40a, and 40b shown in FIGS. 2A and 2B may be divided into the memory core chips 41, 41a, and 41b and the memory logic chips 42, 42a, and 42b shown in FIGS. 2C and 2D, respectively. Each of the memory core chips 41, 41a, and 41b may include a core region (e.g., a cell region) of a memory device. Each of the memory logic chips 42, 42a, and 42b may include a peripheral circuit region of the memory device. Each of the memory core chips 41, 41a, and 41b and the corresponding memory logic chips 42, 42a, and 42b may communicate with each other, respectively. For example, the memory core chips 41a and 41b may be electrically connected to the memory logic chips 42a and 42b through first and second memory data channel bus MBa and MBb, respectively. Referring to FIG. 2C, the memory logic chip 42 may be electrically connected to the buffer chip 50 through the interface data channel bus IB. Referring to FIG. 2D, the memory logic chips 42a and 42b may be commonly connected to the buffer chip 50 through the first and second interface data channel buses IBa and IBb, respectively. The memory core chips 41, 41a, and 41b may be electrically connected to the corresponding memory logic chips 42, 42a, and 42b, respectively. The buffer chip 50 may be commonly electrically connected to the memory logic chips 42, 42a, and 42b. At least one of the memory core chips 41, 41a, and 41, the memory logic chips 42, 42a, and 42b, and the buffer chip 50 may be an unpackaged wafer level chip (e.g., a chiplet). For example, at least one of the memory core chips 41, 41a, and 41b, the memory logic chips 42, 42a, and 42b, and the buffer chip 50 may be provided in the chiplet.

Figure 2E:
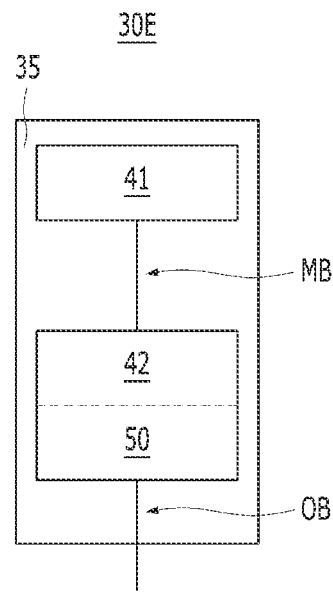
Figure 2F:
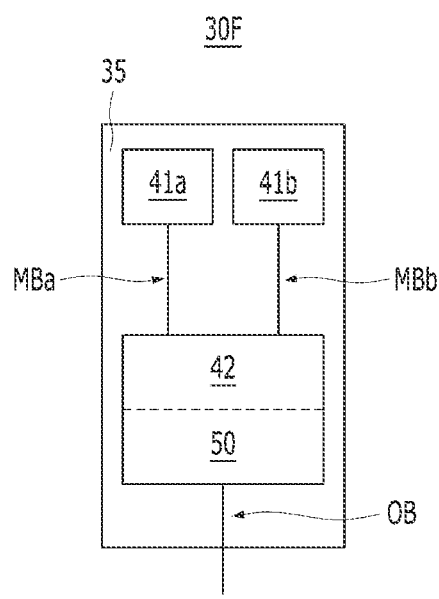
Figure 2G:
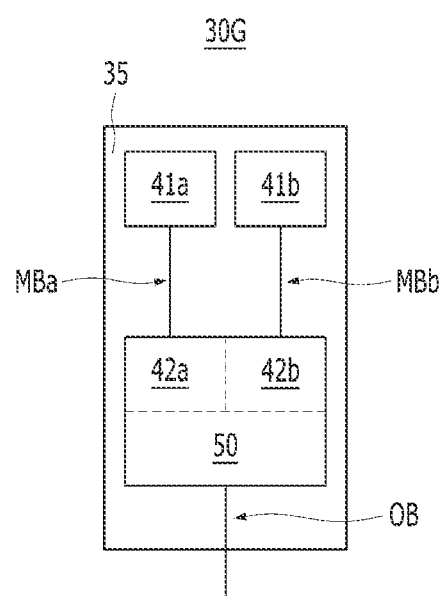

Referring to FIGS. 2E to 2G, memory packages 30E to 30G, according to embodiments of the present invention disclosure, may include memory core chips 41, 41a, and 41b, memory logic chips 42, 42a, and 42b, and a buffer chip 50 all mounted on a package substrate 35. The memory logic chips 42, 42a, and 42b, and the buffer chip 50 may be integrated or merged in one element (e.g., one package or one chip). Compared to FIGS. 2C and 2D, the memory logic chips 42, 42a, and 42b, and the buffer chip 50 may be integrated into one unit chip or one unit circuit block. That is, the memory logic chips 42, 42a, and 42b and the buffer chip 50 may be integrated and mounted on the same PCB or the same silicon layer. Referring to FIG. 2G, the memory logic chips 42a and 42b may be physically separated into a plurality of memory logic chips 42a and 42b to be electrically connected to the corresponding memory core chips 41a and 41b, respectively.

The memory packages 30A to 30G shown in FIGS. 2A to 2G may have a PIP (package(s) in a package) structure in which a plurality of packages is integrated in one package, or a CIP (chip(s) in a package) structure in which a plurality of wafer level chiplets is integrated in one package.

Figure 3A:
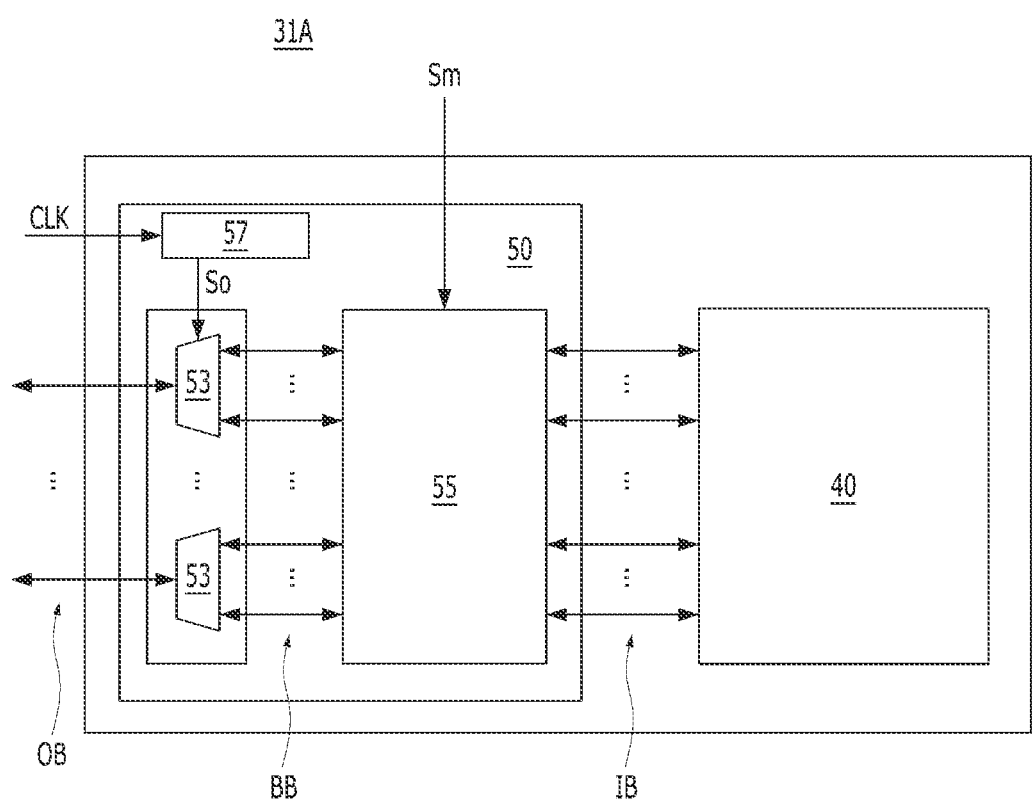
FIGS. 3A to 3D are simplified block diagrams schematically illustrating circuits of memory packages according to embodiments of the present invention disclosure.

FIGS. 3A to 3D are simplified block diagrams schematically illustrating circuits of memory packages 31A to 31D according to embodiments of the present invention disclosure. Referring to FIG. 3A, a memory package 31A according to an embodiment of the present invention disclosure may include a memory chip 40 and a buffer chip 50. The memory package 31A may further include interface data channel buses IB connecting the memory chip 40 to the buffer chip 50. The memory package 31A may communicate with an external device (e.g., a host) through outer data channel buses OB connected to the buffer chip 50.

The memory chip 40 may include a DRAM chip. For example, the memory chip 40 may include cell circuits (i.e., core circuits) and peripheral circuits (i.e., logic circuits) of the DRAM chip. The buffer chip 50 may include multiplexers 53, a data scattering circuit 55, and a plurality of buffer data channel buses BB. The buffer data channel buses BB may electrically connect the multiplexers 53 to the data scattering circuit 55.

Each of the multiplexers 53 may selectively connect one outer data channel bus OB to the plurality of buffer data channel buses BB, respectively. Each of the multiplexers 53 may perform a multiplexing operation and a de-multiplexing operation according to a data input mode and a data output mode based on a clock signal CLK. The clock signal CLK may be provided to each of the multiplexers 53 through the clock controller 57. That is, the clock controller 57 may control the operations of each of the multiplexers 53 by providing an operation signal So to each of the multiplexers 53.

The data scattering circuit 55 may gather or scatter data according to the data input mode and the data output mode. The mode selection signal Sm provided to the data scattering circuit 55 may include a concatenated data processing mode signal, an interleaved data processing mode signal, a random scrambling data processing mode signal, an encoding data processing mode signal, and an exclusive-OR data processing mode signal. Accordingly, the data scattering circuit 55 may perform various operations according to the mode selection signal Sm.

The clock signal CLK and the mode selection signal Sm may be provided from an external device (e.g., a host) through one of a clock bus and a command/address channel bus. Referring to FIGS. 2A to 2G, the memory chip 40 may include a plurality of memory chips including the memory chips 40a and 40b. The memory chip 40 may be independently controlled from the buffer chip 50.

In the data output mode, the data scattering circuit 55 may receive data from the memory chip 40 through the M×N number of interface data channel buses IB, and collect/scatter the data and provide the data to the multiplexers 53. (The M and N are natural numbers.) That is, the data may be distributed in M sets and provided to the N number of multiplexers 53. In an embodiment, the M may be the number of data channel bus sets of one memory chip 40. The N may be the number of data channel buses of each data channel bus set. For example, assuming that the memory chip 40 has two sets of interface data channel bus sets (M=2), and one interface data channel bus set has sixteen interface data channel buses (N=16), total number of the interface data channel buses IB may be thirty-two. Assuming that the number of the multiplexers 53 is sixteen (e.g., if the number of multiplexers 53 and the number of interface data channel buses IB in one set are the same), the data scattering circuit 55 may distribute data on thirty-two interface data channel buses IB into sixteen sets and provide data into each of sixteen multiplexers 53. That is, each of the multiplexers 53 performs a 2:1 multiplexing operation. Accordingly, assuming that each of the multiplexers 53 performs a 2:1 multiplexing operation, data provided through the M×N number of the interface data channel buses IB may be output through (M×N)/2 number of the outer data channel buses OB. In an embodiment, the multiplexers 53 may perform a 4:1 multiplexing operation. In this case, the number of multiplexers 53 may be ½ of the number of one set of interface data channel buses IB. In an embodiment, the multiplexers 53 may perform an 8:1 multiplexing operation. In this case, the number of multiplexers 53 may be ¼ of the number of one set of interface data channel buses IB. In some embodiments, the multiplexers 53 may perform various multiplexing operations, and the number of multiplexers 53 may be also variously set up in association with the number of interface data channel buses IB. Accordingly, according to the inventive concepts of the present invention disclosure, the number of interface data channel buses IB and the number of outer data channel buses OB may be set up to have various correlations.

Figure 3B:
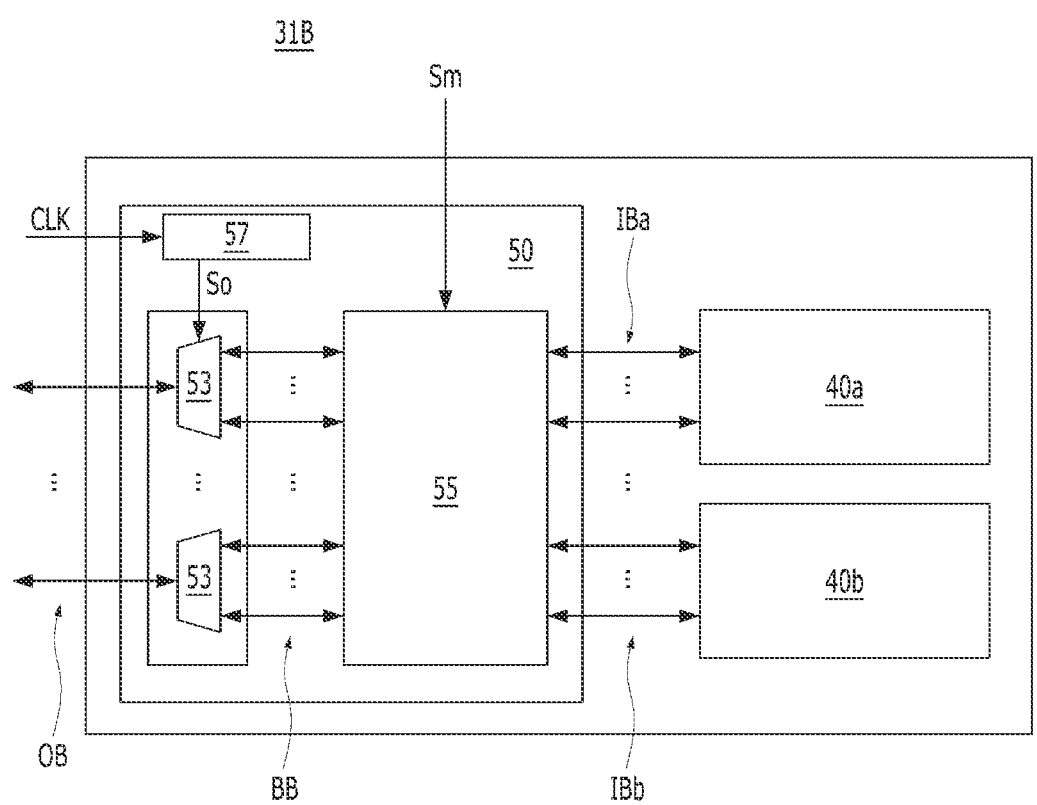

Referring to FIG. 3B, a memory package 31B according to an embodiment of the present invention disclosure may include at least two memory chips 40a and 40b and a common buffer chip 50. The data scattering circuit 55 may receive data from each of the memory chips 40a and 40b through the N number of the interface data channel buses IB.

In an embodiment, the buffer chip 50 may include the N number of the multiplexers 53. For example, the number of the multiplexers 53 may be the same as the number of each of the interface data channel buses IBa and IBb of each of the memory chips 40a and 40b. (e.g., IBa=IBb=N) In an embodiment, the number of the multiplexers 53 may be ½n of the total number of the interface data channel buses IBa and IBb. (The n is a natural number.) In an embodiment, the n may be the number of memory chips 40.

Figure 3C:
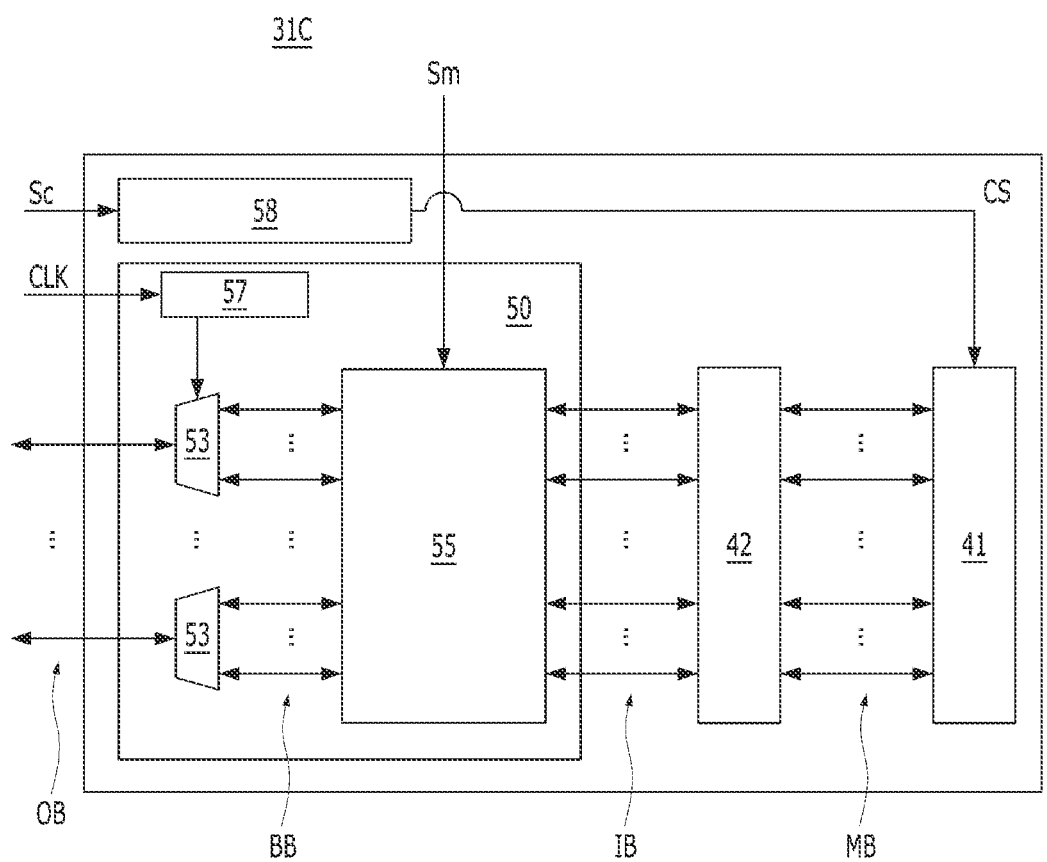

Referring to FIG. 3C, a memory package 31C according to an embodiment of the present invention disclosure may include a memory core chip 41, a memory logic chip 42, and a buffer chip 50. Compared to the memory package 31A of FIG. 3A, the memory chip 40 may be divided into the memory core chip 41 and the memory logic chip 42. Memory data channel buses MB may be formed between the memory core chip 41 and the memory logic chip 42. The number of the memory data channel buses MB and the number of the interface data channel buses IB may be the same. The memory package 31C may further include a memory core control circuit 58. The memory core control circuit 58 may receive the command/address signal Sc and may provide signals to the memory core chip 41 for controlling operations of the memory core chip 41. For example, the memory core control circuit 58 may selectively activate memory banks or memory blocks in the memory core chip 41, or may control the operations for transferring data between the memory core chip 41 and the memory logic chip 42. The operations of the memory package 31C may be understood with reference to FIG. 3A.

Figure 3D:
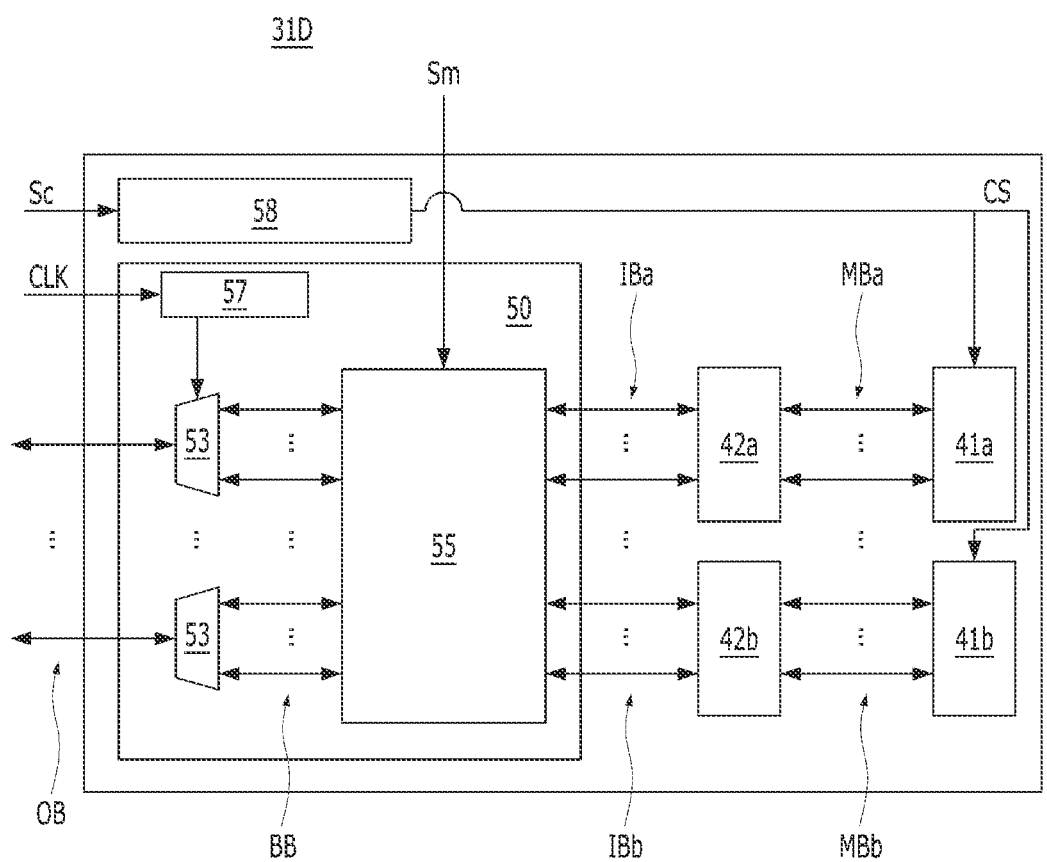

Referring to FIG. 3D, the memory package 31D, according to an embodiment of the present invention disclosure, may include memory core chips 41a and 41b, memory logic chips 42a and 42b, and a common buffer chip 50. The memory package 31D of FIG. 3D may be understood with reference to FIGS. 3A to 3C. The inventive concepts of the memory packages 31A to 31D shown in FIGS. 3A to 3D may be selectively applied to the memory packages 30A to 30G described with reference to FIGS. 2A to 2G.

The memory packages 31A to 31D illustrated in FIGS. 3A to 3D may output a data format required by a host, a processor, a memory controller, or the like, according to a mode selection signal Sm transmitted from the host. For example, when the mode selection signal Sm is a serial data processing mode signal, the buffer chip 50 may sequentially output the data from the memory chips 40, 40a, and 40b and the memory core chips 41, 41a, and 41b. When the mode selection signal Sm is an alternating data processing mode signal, the buffer chip 50 may divide the data from the memory chips 40, 40a, and 40b and the memory core chips 41, 41a, and 41b into P pieces and may alternately output the divided data. (The P is a natural number.) When the mode selection signal Sm is a random scrambling data processing mode signal, the buffer chip 50 may randomly scramble the data from the memory chips 40, 40a, and 40b and the memory core chips 41, 41a, and 41b according to a set up pattern and outputs the scrambled data. When the mode selection signal Sm is an encoding processing mode signal, the buffer chip 50 may output the data from the memory chips 40, 40a, and 40b and the memory core chips 41, 41a, and 41b according to the encoding pattern. When the mode selection signal Sm is an XOR processing signal mode, the buffer chip 50 may pre-define the data from the memory chips 40, 40a, and 40b and the memory core chips 41, 41a, and 41b according to the XOR process, and may output the pre-define data. Accordingly, the memory packages 31A to 31D according to the inventive concepts of the present invention disclosure may provide various data types that can be directly used in the host or the like. In addition, the buffer chip 50 may include various mode functions that support the data formats required by the host.

The memory chip 40 may include at least two or more pseudo channels. Each of the pseudo channels may output 64 bytes of data. The pseudo channels may be used as the data channel buses in the sequential data processing mode or an alternating data processing mode. In the random scrambling data processing mode, data may be scrambled onto the data channel buses through a seed, such as a random seed, on the pseudo channels. In the encoding data processing mode and the XOR data processing mode, data may be applied to all data channel buses including the pseudo channels. In an embodiment, the memory chip 40 may have a function of optimizing a row address strobe (RAS) signal such as a single device data correction (SDDC) or a half-chip-kill through the pseudo channels.

Figure 4A:
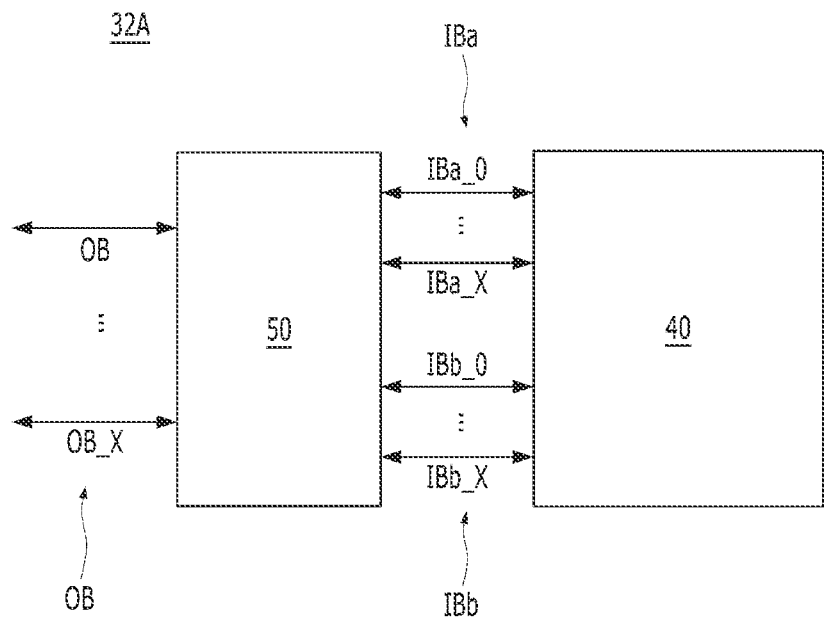
FIGS. 4A to 4D are simplified schematics illustrating data transmission through data channel buses by data collecting/scattering operations of memory packages according to embodiments of the present invention disclosure.

FIGS. 4A to 4D are simplified schematics illustrating data transmission through the data channel buses OB, IBa, IBb, MBa, and MBb by data collecting/scattering operations of memory packages 32A to 32D according to embodiments of the present invention disclosure. Referring to FIG. 4A, a memory package 32A according to an embodiment of the present invention disclosure may include a memory chip 40, a buffer chip 50, 2X number of interface data channel buses IBa and IBb between the memory chip 40 and the buffer chip 50, and X number of outer data channel buses OB between the buffer chip 50 and an external device (e.g., the driving chip 20). (The X is a natural number.) The interface data channel buses IBa and IBb may be disposed between two memory elements (e.g., two memory banks, two memory blocks, two memory regions, or two memory chips) and the buffer chip 50. That is, the first interface data channel buses IBa may electrically connect the first element (e.g., first memory bank, first memory block, first memory area, or first memory chip) and the buffer chip 50 to transmit data, and the second interface data channel buses IBb may electrically connect the second memory element (e.g., second memory bank, second memory block, second memory region, or second memory chip) and the buffer chip 50 to transmit data. The buffer chip 50 may receive data from the memory chip 40 through the 2X number of interface data channel buses IBa and 1Bb and provide the data to the external device through the X number of outer data channel buses OB. Alternatively, the buffer unit 50 may receive data from the external device through the X number of outer data channel buses OB and provide the data to the memory chip 40 through the 2X number of interface data channel buses IBa and IBb. The outer data channel buses OB may have a data density and a data transfer speed that is twice as fast as those of the interface data channel buses IBa and IBb. That is, the buffer chip 50 can reduce the channel width (bus numbers) by half and double the transmission density or transmission speed in a data output mode. In addition, the buffer chip 50 may double the channel width (bus numbers) and reduce the transmission density or transmission rate by half in a data input mode.

Figure 4B:
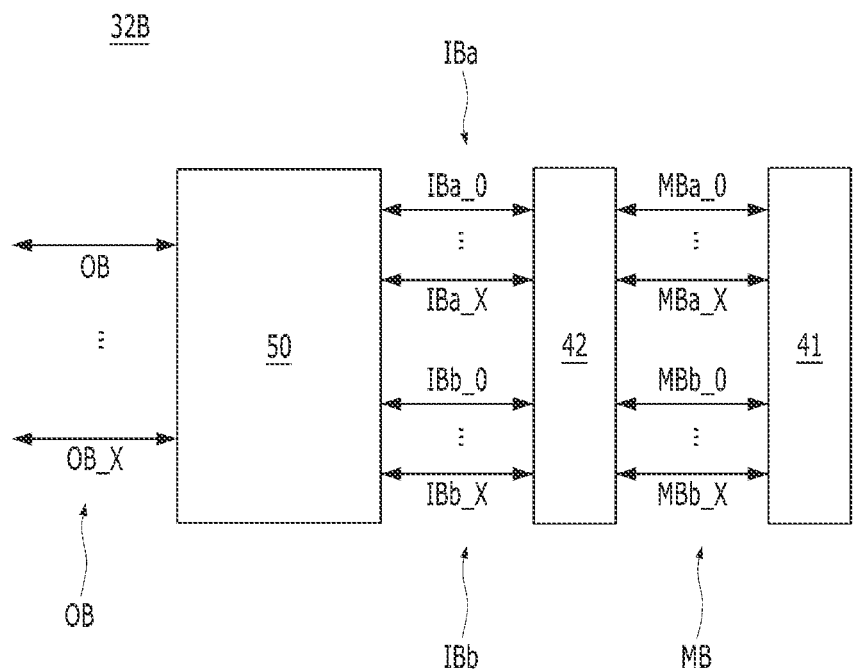

Referring to FIG. 4B, a memory package 32B according to an embodiment of the present invention disclosure may include a memory core chip 41, a memory logic chip 42, a buffer chip 50, 2X number of memory data channel buses MBa and MBb between the memory core chip 41 and the memory logic chip 42, 2X number of interface data channel buses IBa and IBb between memory logic chip 42 and buffer chip 50, and X number of outer data channel buses OB between the buffer chip 50 and an external device (e.g., the driving chip 20).

Figure 4C:
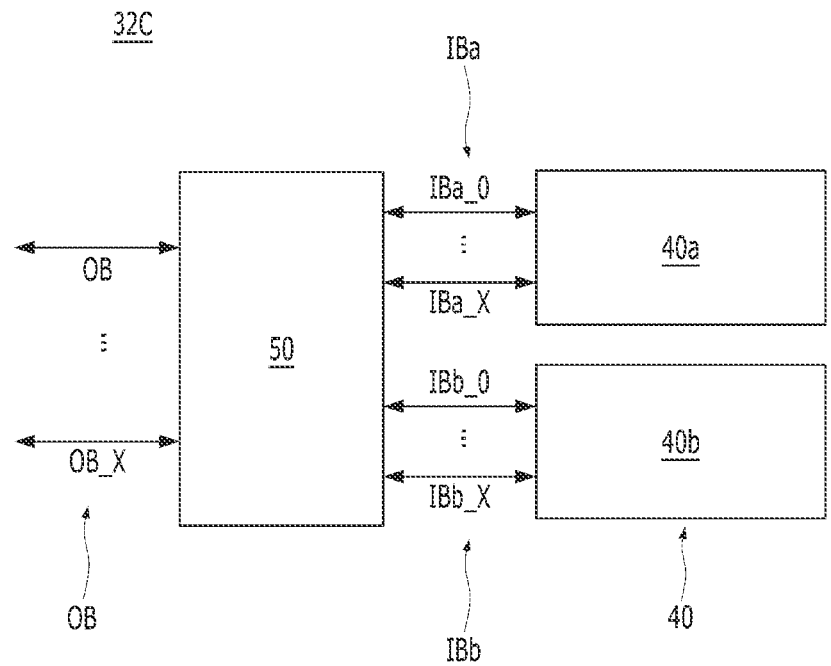

Referring to FIG. 4C, a memory package 32C according to an embodiment of the present invention disclosure may include a first memory chip 40a, a second memory chip 40b, a buffer chip 50, X number of first interface data channel buses IBa between the first memory chip 40a and the buffer chip 50, X number of second interface data channel buses IBb between the second memory chip 40b and the buffer chip 50, and X number of outer data channel buses OB between the buffer chip 50 and an external device (e.g., the driving chip 20). The number of first interface data channel buses IBa, the number of second interface data channel buses IBb, and the number of outer data channel buses OB may be the same. Accordingly, the buffer chip 50 may be connected to the X number of the outer data channel buses OB and the 2X number of the interface data channel buses IBa and IBb.

Figure 4D:
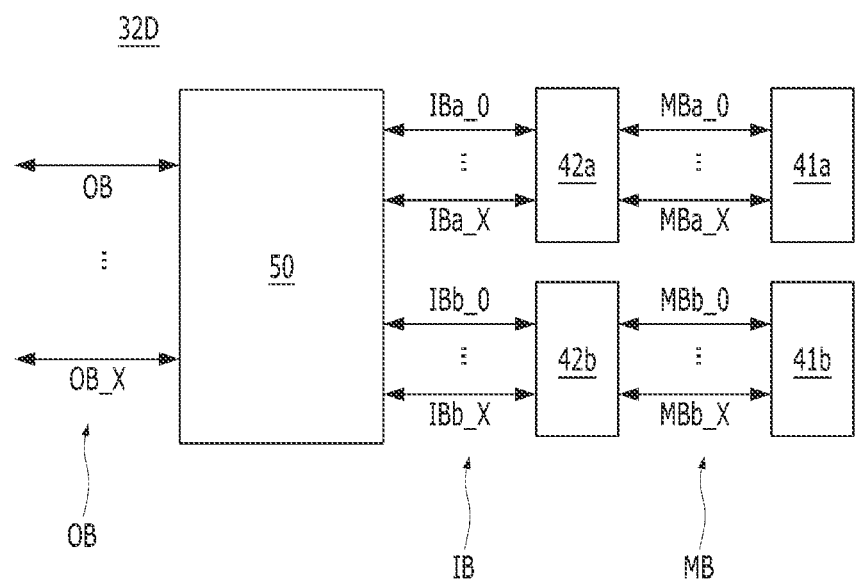

Referring to FIG. 4D, a memory package 32D according to an embodiment of the present invention disclosure may include a first memory core chip 41a, a second memory core chip 41b, a first memory logic chip 42a, a second memory logic chip 42b, a buffer chip 50, X number of first memory data channel buses MBa between the first memory core chip 41a and the first memory logic chip 42a, X number of second memory data channel buses MBb between the second memory core chip 41b and the second memory logic chip 42b, X number of first interface data channel buses IBa between the first memory logic chip 42a and the buffer chip 50, X number of second interface data channel buses IBb between the second memory logic chip 42b and the buffer chip 50, and X number of outer channel buses OB between the buffer chip 50 and an external device (e.g., the driving chip 20). The number of the first interface data channel buses IBa, the number of the second interface data channel buses IBb, and the number of outer data channel buses OB may be the same. Accordingly, the buffer chip 50 may be connected to the X number of outer data channel buses OB and the 2X number of interface data channel buses IBa and IBb.

Referring to FIGS. 4A to 4D, the buffer chip 50 of the memory packages 32A to 32D can reduce a total channel width of the interface data channel buses IBa and IBb by half and double the data transmission density and data transmission speed to provide the data from the memory chips 40, 40a, and 40b or the memory core chips 41, 41a, and 41b to the external device. Alternatively, the buffer chip 50 of the memory packages 32A to 32D can double the channel width of the outer data channel buses OB and reduces the data transmission density and data transmission speed by half to transfer the data from the external device to the memory chips 40, 40a, and 40b or the memory core chips 41, 41a, and 41b.

According to the inventive concepts of the present invention disclosure, the memory packages 32A to 32D may have nX number of the interface data channel buses IBa and IBb, and X number of the outer data channel buses OB. (The n and X are natural numbers.) In an embodiment, the X and n may each be $2^m$. (The m is a natural number.) In another embodiment, the number of outer data channel buses OB may be ½n compared to the number of interface data channel buses IBa and IBb.

The inventive concepts of the memory packages 32A to 32D described with reference to FIGS. 4A to 4D can be selectively applied to the memory packages 30A to 30G and 31A to 31D described with reference to FIGS. 2A to 2G and 3A to 3D.

When the data scattering circuit 55 operates in the serial data processing mode, the data scattering circuit 55 may provide data received through the interface data channel buses IB, IBa, and IBb to the multiplexers 53. According to the operation signal So, the multiplexers 53 may firstly output the data provided through the first interface data channel buses IBa from the memory chip 40 or the first memory chip 40*a*, then may output the data provided through the second interface data channel buses IBb of the memory chip 40 or the second memory chip 40*b*. (Ex. [IBa_0/IBa_1/IBa_2/ . . . /IBa_X/IBb_0/IBb_1/IBb_2/ . . . /IBb_X]) When the multiplexers 53 perform the N:1 multiplexing operation (the N is a natural number greater than or equal to 3), the buffer chip 50 can output the data provided through the interface data channel buses IB1 to IBN in the following order: [IB1_0/IB1_1/IB1_2/ . . . /IB1_X/IB2_0/IB2_1/IB2_2/ . . . /IB2_X/ . . . /IBN_0/IBN_1/IBN_2/ . . . /IBN_X].

When the data scattering circuit 55 operates in the alternating data processing mode, the data scattering circuit 55 may provide the data provided from the interface data channel buses IB to the same multiplexers 53. According to the operation signal So, the multiplexers 53 may alternately output the data provided through the interface channel buses IBa and IBb from the memory chips 40*a* and 40*b*. For example, the buffer chip 50 may output the data in the following order: [IBa_0/IBb_0/IBa_1/IBb_1/IBa_2/IBb_2/ . . . /IBa_X/IBb_X].

When the multiplexers 53 perform an N:1 multiplexing operation, the buffer chip 50 may output data in the following order: [IB1_0/IB2_0/ . . . /IBN_0/IB1_1/IB2_1/ . . . /IBN_1/IB1_2/IB2_2/ . . . /IBN_2/ . . . /IB1_X/IB2_X/ . . . /IBN_X].

FIGS. 5A to 5L are simplified block diagrams schematically illustrating configurations of memory packages 33A to 33L according to embodiments of the present invention disclosure. Referring to FIGS. 5A to 5L, memory packages 33A to 33L according to embodiments of the present invention disclosure may include memory chips 40*a* and 40*b*, memory core chips 41, 41*a*, and 41*b*, memory logic chips 42, 42*a*, and 42*b*, and a buffer chip 50 mounted on a package substrate 35. The memory packages 33A to 33L may further include an encapsulant 70 covering the memory chips 40*a* and 40*b*, the memory core chips 41, 41*a*, and 41*b*, the memory logic chips 42, 42*a*, and 42*b*, and the buffer chip 50. The encapsulant 70 may include an epoxy molding compound (EMC) or polyimide (e.g., PIQ, Polyimide Isoindro Quindzoline).

Figure 5A:
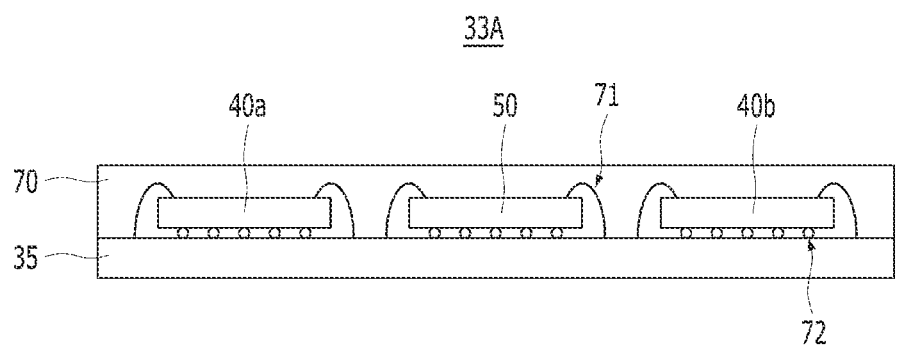
Figure 5B:
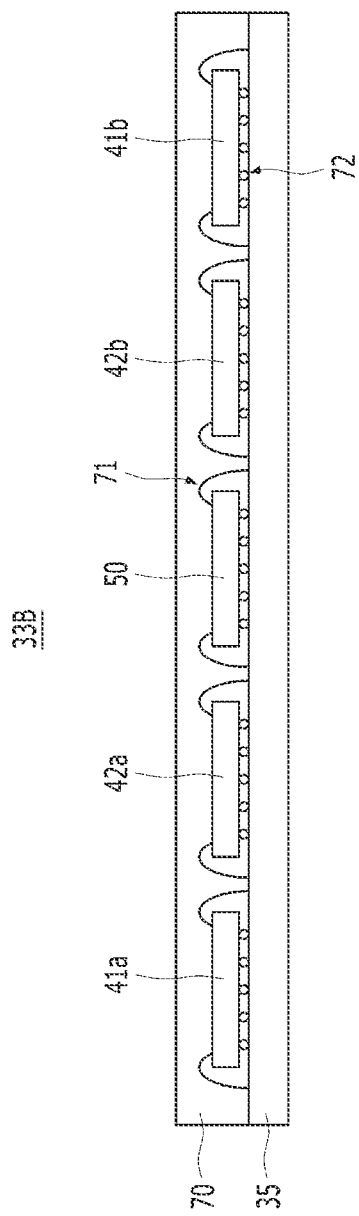
Figure 5C:
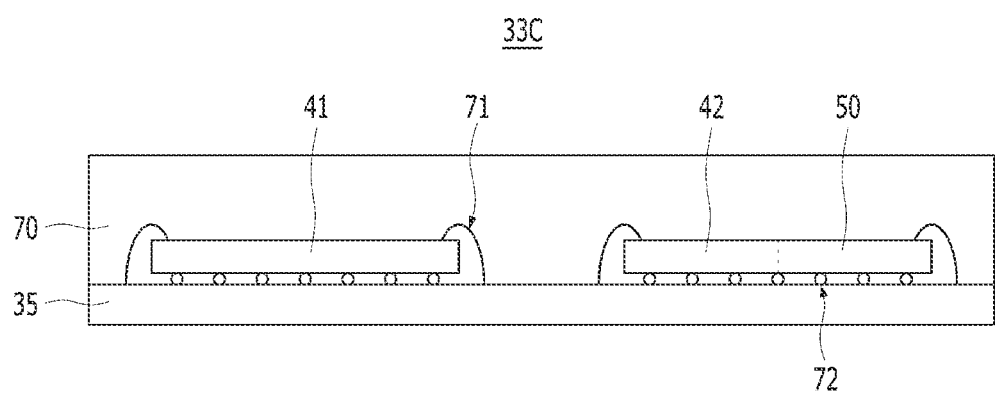

Referring to FIG. 5A, the memory package 33A according to an embodiment of the present invention disclosure may include the memory chips 40*a* and 40*b*, and the buffer chip 50 mounted on the package substrate 35. Referring to FIG. 5B, the memory package 33B according to an embodiment of the present invention disclosure may include the memory core chips 41*a* and 41*b*, the memory logic chips 42*a* and 42*b*, and the buffer chip 50 mounted on the package substrate 35. Referring to FIG. 5C, the memory package 33C according to an embodiment of the present invention disclosure may include the memory core chip 41 and an integrated memory core chip 42 and buffer chip 50 mounted on the package substrate 35. For example, memory core chip 42 and the buffer chip 50 may be integrated in a single chip. Referring to FIG. 5D, the memory package 33D according to an embodiment of the present invention disclosure may include the memory core chips 41*a* and 41*b*, and an integrated memory logic chips 42*a* and 42*b* and buffer chip 50 mounted on the package substrate 35. The memory logic chips 42*a* and 42*b* and the buffer chip 50 may be integrated in a single chip.

In an embodiment, the package substrate 35 may be a printed circuit board (PCB). In another embodiment, the package substrate 35 may be a redistribution layer. The redistribution layer may include a silicon layer. In an embodiment, the memory chips 40*a* and 40*b*, the memory core chips 41, 41*a*, an 41*b*, the memory logic chips 42, 42*a*, and 42*b*, and the buffer chip 50 may be connected to the package substrate 35 through bonding wires 71. In some embodiments, the memory chips 40*a* and 40*b*, the memory core chips 41, 41*a*, and 41*b*, the memory logic chips 42, 42*a*, and 42*b*, and the buffer chip 50 may each be individually packaged in single packages. In an embodiment, the memory chips 40*a* and 40*b*, the memory core chips 41, 41*a*, and 41*b*, the memory logic chips 42, 42*a*, and 42*b*, and the buffer chip 50 may be wafer level chips, for example, chiplets. The memory chips 40*a* and 40*b*, the memory core chips 41, 41*a*, and 41*b*, the memory logic chips 42, 42*a*, and 42*b*, and the buffer chip 50 may be electrically connected to the package substrate 35 through bumps 72.

The package substrate 35 may include substrate interconnections embedded therein or redistribution lines in the redistribution layer. In an embodiment, the memory chips 40*a* and 40*b*, the memory core chips 41, 41*a*, and 41*b*, the memory logic chips 42, 42*a*, and 42*b*, and the buffer chip 50 may be electrically connected to each other through the redistribution lines.

Figure 5E:
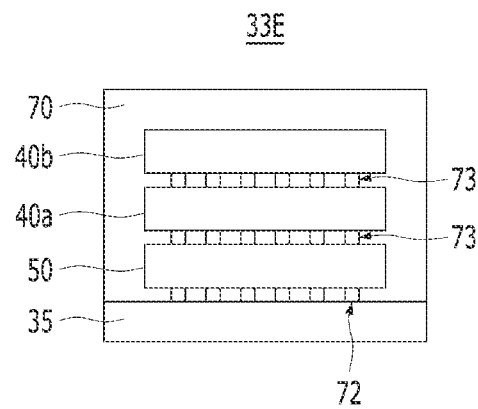
Figure 5F:
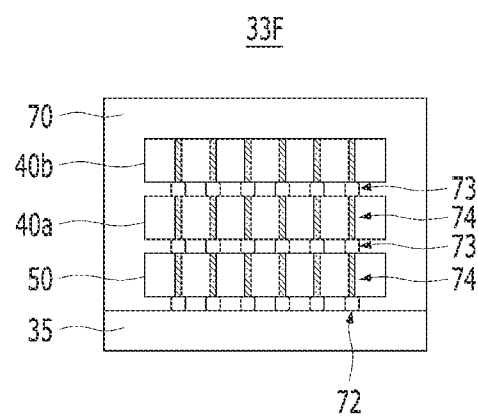
Figure 5G:
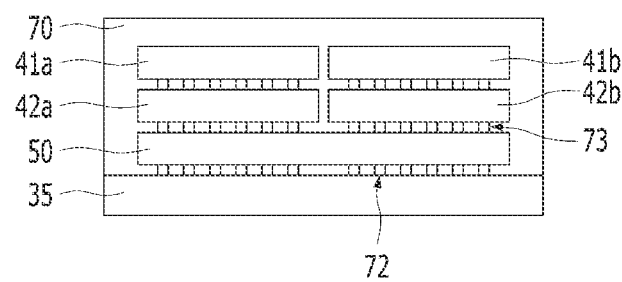
Figure 5H:
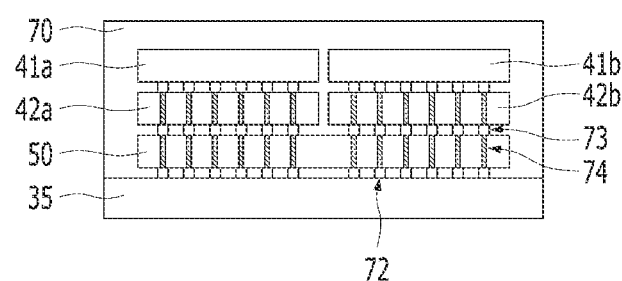
Figure 5I:
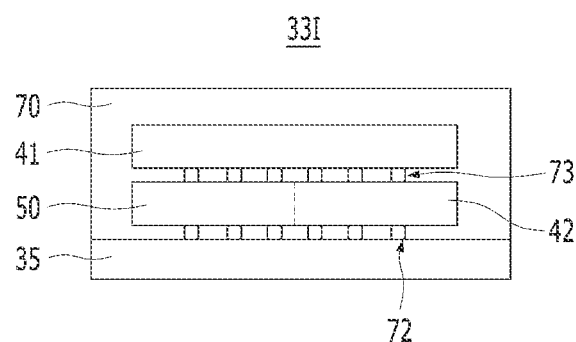
Figure 5J:
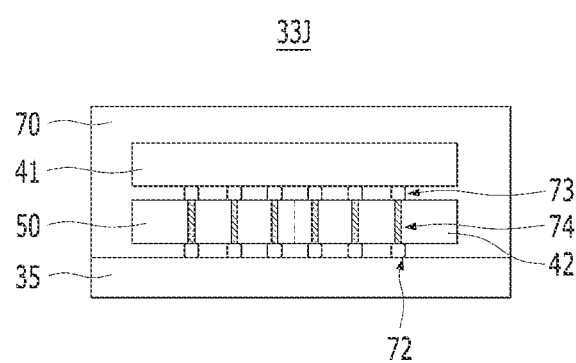
Figure 5K:
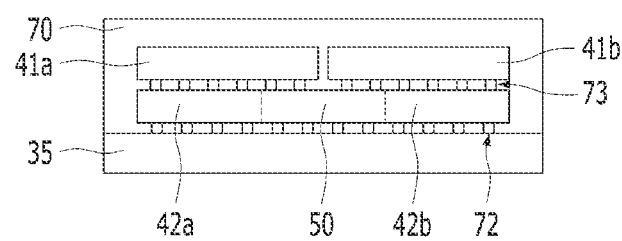
Figure 5L:
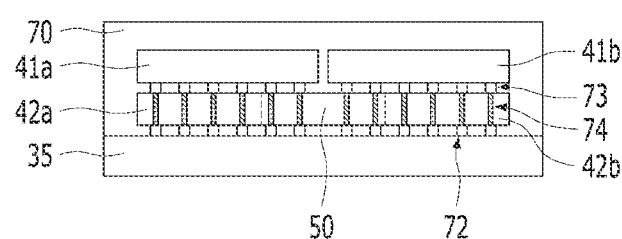

Referring to FIGS. 5E and 5F, the memory packages 33E and 33F according to the embodiments of the present invention disclosure may include the memory chips 40*a* and 40*b*, and the buffer chip 50 stacked over each other on the package substrate 35. Referring to FIGS. 5G and 5H, the memory packages 33G and 33H according to the embodiments of the present invention disclosure may include the memory core chips 41*a* and 41*b*, the memory logic chips 42*a* and 42*b*, and the buffer chip 50 stacked on the package substrate 35, respectively. Referring to FIGS. 5I and 5J, the memory packages 33I and 33J according to the embodiments of the present invention disclosure may include the memory core chip 41, and an integrated memory logic chip 42 and a buffer chip 50 stacked on the package substrate 35. That is, the memory logic chip 42 and the buffer chip 50 may be integrated into a single chip. Referring to FIGS. 5K and 5L, the memory packages 33K and 33L according to the embodiments of the present invention disclosure may include the memory core chips 41*a* and 41*b*, and an integrated memory logic chips 42*a* and 42*b* and buffer chip 50 stacked on a package substrate 35, respectively. That is, the memory logic chips 42*a* and 42*b* and the buffer chip 50 may be integrated into a single chip.

The memory chips 40*a* and 40*b*, the memory core chips 41, 41*a*, 41*b*, the memory logic chips 42, 42*a*, 42*b*, and the buffer chip 50 may be electrically connected to the package substrate 35 through the bumps 72. The bumps 72 may include solder balls or metal pads.

The memory chips 40*a* and 40*b*, the memory core chips 41, 41*a*, and 41*b*, the memory logic chips 42, 42*a*, and 42*b*, and the buffer chip 50 may be electrically connected to each other through the micro bumps 73. In an embodiment, the micro bumps 73 may include solder balls. In an embodiment, the micro bumps 73 may include metal pads. For example, the memory chips 40*a* and 40*b*, the memory core chips 41, 41*a*, and 41*b*, the memory logic chips 42, 42*a*, and 42*b*, and the buffer chip 50 may be stacked and bonded in a hybrid bonding structure.

Referring to FIGS. 5F, 5H, 5J, and 5L, the memory packages 33F, 33H, 33J, and 33L may further include through-vias 74 vertically penetrating the memory chips 40a and 40b, the memory core chips 41, 41a, and 41b, and the memory logic chips 42, 42a, and 42b, and the buffer chip 50. That is, the micro bumps 73 may be electrically connected to each other through the through-vias 74 in a vertical direction.

According to embodiments of the present invention disclosure, data output speed of a memory package and a memory module can be increased.

While the present invention disclosure has been described with respect to the specific embodiments, it will be apparent to those skilled in the art that various changes and modifications may be made without departing from the spirit and scope of the invention as defined in the following claims.

What is claimed is:

1. A single memory package comprising:
a package substrate;
a first memory core chip, a second memory core chip, a first memory logic chip, a second memory logic chip, and a buffer chip mounted on the package substrate;
a plurality of first memory data channel buses between the first memory core chip and the first memory logic chip;
a plurality of second memory data channel buses between the second memory core chip and second memory logic chip;
a plurality of first interface data channel buses between the first memory logic chip and the buffer chip;
a plurality of second interface data channel buses between the second memory core chip and the buffer chip; and
a plurality of outer data channel buses connected to the buffer chip,
wherein:
the first memory core chip includes a first memory cell region,
the second memory core chips includes a second memory cell region,
the first memory logic chip includes a first peripheral circuit region,
the second memory logic chip includes a second peripheral circuit region,
wherein the buffer chip receives data from the first and second memory logic chips through the first and second interface data channel buses, and provides the data to an external device through the outer data channel buses, and
wherein the first memory data channel buses, the second memory data channel buses, the first interface data channel buses, the second interface data channel buses, and the outer data channel buses have a same number.

2. The single memory package of claim 1, wherein each of the first and second interface data channel buses further comprise at least two pseudo channel buses.

3. The single memory package of claim 2, wherein the buffer chip is configured to provide a seed signal to the pseudo channel buses to perform a random scrambling operation.

4. The single memory package of claim 1, wherein:
the package substrate comprises one of a printed circuit board or a redistribution layer, and
each of the first memory core chip, the first memory logic chip, the second memory core chip, the second memory logic chip, and the buffer chip are individually packaged.

5. The single memory package of claim 4, wherein each of the first memory core chip, the first memory logic chip, the second memory core chip, the second memory logic chip, and the buffer chip are electrically connected to the package substrate through bonding wires.

6. The single memory package of claim 1, wherein:
the package substrate comprises one of a printed circuit board or a redistribution layer, and
at least one of the first memory core chip, the first memory logic chip, the second memory core chip, the second memory logic chip, and the buffer chip is a chiplet in a wafer level.

7. The single memory package of claim 6, wherein:
the buffer chip, the first and second memory logic chips, and the first and second memory core chips are vertically stacked, and
the package substrate, the buffer chip, the first memory logic chip and the first memory core chip, and the second memory logic chip and the second memory core chip are electrically connected to each other through bumps.

8. The single memory package of claim 7, wherein:
the bumps comprise copper pads, and
the buffer chip, the first memory logic chip and the first memory core chip, and the second memory logic chip and the second memory core chip are bonded in a hybrid bonding structure.

9. The single memory package of claim 8, further comprising through-vias vertically passing through the buffer chip.

10. The single memory package of claim 1, wherein the first and second memory logic chips, and the buffer chip are integrated into one package.

11. The single memory package of claim 1, wherein the first and second memory logic chips are stacked on the buffer chip, and the first and second memory core chips are stacked on the first and second memory logic chips, respectively.

12. A single memory package comprising:
a package substrate;
at least one memory chip and a buffer chip mounted on the package substrate;
M×N number of interface data channel buses between the memory chip and the buffer chip; and
(M×N)/2n number of outer data channel buses connected to the buffer chip,
wherein the buffer chip receives data from the memory chip through the interface data channel buses, and provides the data through the outer data channel buses, wherein the M, N, and n are natural numbers,
wherein:
the M is a number of sets of the interface data channel buses, and
the N is a number of the interface data channel buses in each of the sets,
wherein the buffer chip is configured to receive the M×N number of the data from the memory chip and alternately output each set of data, and
wherein the buffer chip is configured to receive 2N number of the data on an A set of the N number of the interface data channel buses and a B set of the N number of the interface channel buses from the memory chip and alternately output the data in the following order:
[A_0/B_0/A_1/B_1/A_2/B_2/ . . . /A_N/B_N].

13. A single memory package comprising:
a package substrate;
a first memory chip, a second memory chip, and a buffer chip mounted on the package substrate;

a first set of N number of interface data channel buses between the first memory chip and the buffer chip, wherein the first memory chip and the buffer chip communicate with each other through the first set of the N number of interface data channel buses;

a second set of the N number of the interface data channel buses between the second memory chip and the buffer chip, wherein the second memory chip and the buffer chip communicate with other through the second set of the N number of the interface data channel buses; and an N number of outer data channel buses connected to the buffer chip, wherein the buffer chip communicates with an external device through the N number of the outer data channel buses, wherein the buffer chip is configured to receive data from the first and second memory chips and output the data to the external device by operating in selected one mode of a chain data processing mode, an alternating data processing mode, a random scrambling data processing mode, an encoding data processing mode, and XOR data processing mode, wherein the N is a natural number.

14. The single memory package of claim 13, wherein:

the buffer chip includes multiplexers and a data scattering circuit, the multiplexers are configured to operate according to a clock signal provided to a clock distribution counter, and the data scattering circuit is configured to operate in the modes selected according to a mode selection signal.

* * * * *